United States Patent [19]

Nakahara et al.

[11] Patent Number: 5,442,163
[45] Date of Patent: Aug. 15, 1995

[54] EXPOSURE APPARATUS

[75] Inventors: Kanefumi Nakahara; Masao Nakajima, both of Yokohama; Toshinori Tsuruya, Kawasaki, all of Japan

[73] Assignee: Nikon Corporation, Tokyo, Japan

[21] Appl. No.: 249,268

[22] Filed: May 25, 1994

[30] Foreign Application Priority Data

Jun. 29, 1993 [JP]  Japan .................................. 5-159687

[51] Int. Cl.6 ...................... G06F 15/20; G06F 15/24
[52] U.S. Cl. .................................... 235/381; 235/375
[58] Field of Search ............................. 235/375, 381

[56] References Cited

U.S. PATENT DOCUMENTS

| | | |
|---|---|---|
| 4,433,547 | 2/1984 | Firey ................................ 60/711 |
| 4,567,361 | 1/1986 | Rosenthal .......................... 235/462 |
| 4,715,392 | 12/1987 | Abe et al. ............................ 134/62 |
| 5,095,195 | 3/1992 | Harman ............................ 235/381 |

FOREIGN PATENT DOCUMENTS

3-783  1/1991  Japan .

*Primary Examiner*—Harold Pitts
*Attorney, Agent, or Firm*—Shapiro and Shapiro

[57] ABSTRACT

An exposure apparatus equipped with a substrate supervisory device is contained in an air-conditioned chamber with a front door. The device has a library for storing a plurality of reticle cases with respective reticles therein, a bar code reader for reading respective bar codes of the reticle cases and shifting means for shifting the bar code reader for the reading. When an operator stores the cases in the library by opening the door of the chamber, the bar code reader is retreated to a predetermined position and the shifting means will not be activated for the operator's safety.

12 Claims, 6 Drawing Sheets

EXPOSURE APPARATUS

BACKGROUND OF THE INVENTION

1. Field of the Invention

The present invention relates to an exposure apparatus equipped with a substrate supervisory apparatus in which a plurality of various reticles or masks to be used in a semiconductor manufacturing apparatus, a liquid crystal substrate manufacturing apparatus or the like can be stored and supervised constantly under a clean condition and a desired reticle or mask can be taken out for use as required.

2. Related Background Art

In a photolithography process constituting a semiconductor manufacturing process or a liquid crystal display device manufacturing process, a circuit pattern is printed on a wafer by use with a reticle or a mask. Usually, patterns to be utilized in respective photolithography processes are different from each other. Therefore, a large number of different reticles or masks are needed for respective photolithography processes. And, a desired reticle or mask is selected from a large number of different reticles or masks to effect a photolithography process. Usually, a large number of reticles or masks are stored or supervised in a reticle stocker or a reticle changer constantly. When storing a reticle or mask in such a supervisory apparatus, it is necessary to manually input the information of the reticle or mask in a control computer. For that reason, the identification information is written on the reticle or mask. And, an operator observes the identification information of the reticle or mask visually to check it by opening its substrate case and thereafter inputs the information from a console. In another case, the identification information of a reticle or mask is written on a substrate case. Then, the operator inputs the identification information from the console by visually observing the identification information on the substrate case. Recently, the identification information of a reticle or mask on a substrate case is indicated by a bar code, making it possible to input the identification information halfway automatically. Similarly, when taking out the reticle or mask from the supervisory apparatus together with the substrate case, the above-mentioned operation is carried out.

However, in the above methods, as the operator checks visually the identification information or identification mark on the substrate such as the reticle or mask and inputs it manually, there is a problem that the operator often reads and inputs the identification information of the substrate or the substrate case erroneously. Similarly, when the operator reads the identification mark such as the bar code on the substrate by use with a bar code reader, the operator's manual or visual operations are interposed invariably, so that there is a danger of inputting wrong information. Further, there is a method that identification marks given to a substrate such as a reticle or mask and a case for containing the substrate are automatically read by the apparatus and the read information is processed as an apparatus constant (parameter). However, in this case, when the reticle or mask contained in the substrate case is not properly combined with the substrate case, the comparison thereof cannot be conducted, so that a wafer is exposed by a stepper, an aligner or the like with the wrong reticle or mask. Therefor, if the identification mark of the reticle or mask and that of the case are automatically read and compared with each other, such a problem can be solved. However, therefore, it is necessary to provide an exposure apparatus or the like with a built-in device for automatically reading the information pattern such as the identification mark on the substrate case. In this case, as the automatic reading device is provided in the vicinity of a substrate case loading section, the operator would be injured if the automatic reading device happens to be activated while the operator is loading or replacing the substrate case.

SUMMARY OF THE INVENTION

It is an object of the present invention to provide an exposure apparatus equipped with an automatic reading device for reading the information given to substrate cases in which safety measurement is taken for an operator.

The present invention is applied to an apparatus for processing a plurality of masks which comprises a case storing means for removably holding a plurality of cases for containing respective masks, mask processing means for drawing the mask of selected one of the cases and processing the selected mask and containing means containing the case storing means as well as the mask processing means and having an openable door at a position opposite to a case loading section of the case storing means. Further, the present invention is provided with information reading means disposed close to the case loading section of the case storing means in the containing means so as to read case information patterns given to respective specific positions of the cases and shifting means for relatively shifting the information reading means and the case storing means along the aligning direction of the plurality of cases such that the information reading means becomes opposite to the respective specific positions of the cases. Also, the present invention is provided with a control means (control computer in the apparatus) for detecting whether there is hindrance for the shifting means to be driven and outputting a detection signal and starting or stopping the operation of the shifting means based on the detection signal.

The state where there is not hindrance for the shifting means to be driven means a case where the operator does not put his hand in the case storing section. In this case, the control means judges by detecting whether the door of the containing means is opened or the operator's hand is put in the case storing means.

Another case is that all the cases are loaded in the proper positions. Also, in this case, the control means judges by detection of the case loading condition.

Further, when the present invention is applied to the exposure apparatus, the containing means may include air conditioning means for providing an air-conditioned and dustproof space therein.

The present invention can provide an exposure apparatus which can prevent an accident which, in the conventional apparatus, is apt to be caused by inadvertent relative movement between the case storing section and the reading means when the operator mounts the mask cases in the apparatus or replaces the sames. Further, in the inventive exposure apparatus, the opening door of an air-conditioned chamber can be locked so as not to open during the operation of the reading means, so even an unexperienced operator can work safely. Furthermore, in the case where the cases are incompletely mounted in the case storing section of the conventional apparatus, there would be possibilities of erroneous detections even if the reading means are capable of reading information patterns of the cases, but in the inventive apparatus no reading error due to incomplete mounting of the cases is caused. Moreover, it is possible to prevent the reading means from hitting against the case, when the reading means performs the relative movement due to incomplete mounting of the case.

DETAILED DESCRIPTION OF THE PREFERRED EMBODIMENTS

Figure 1:
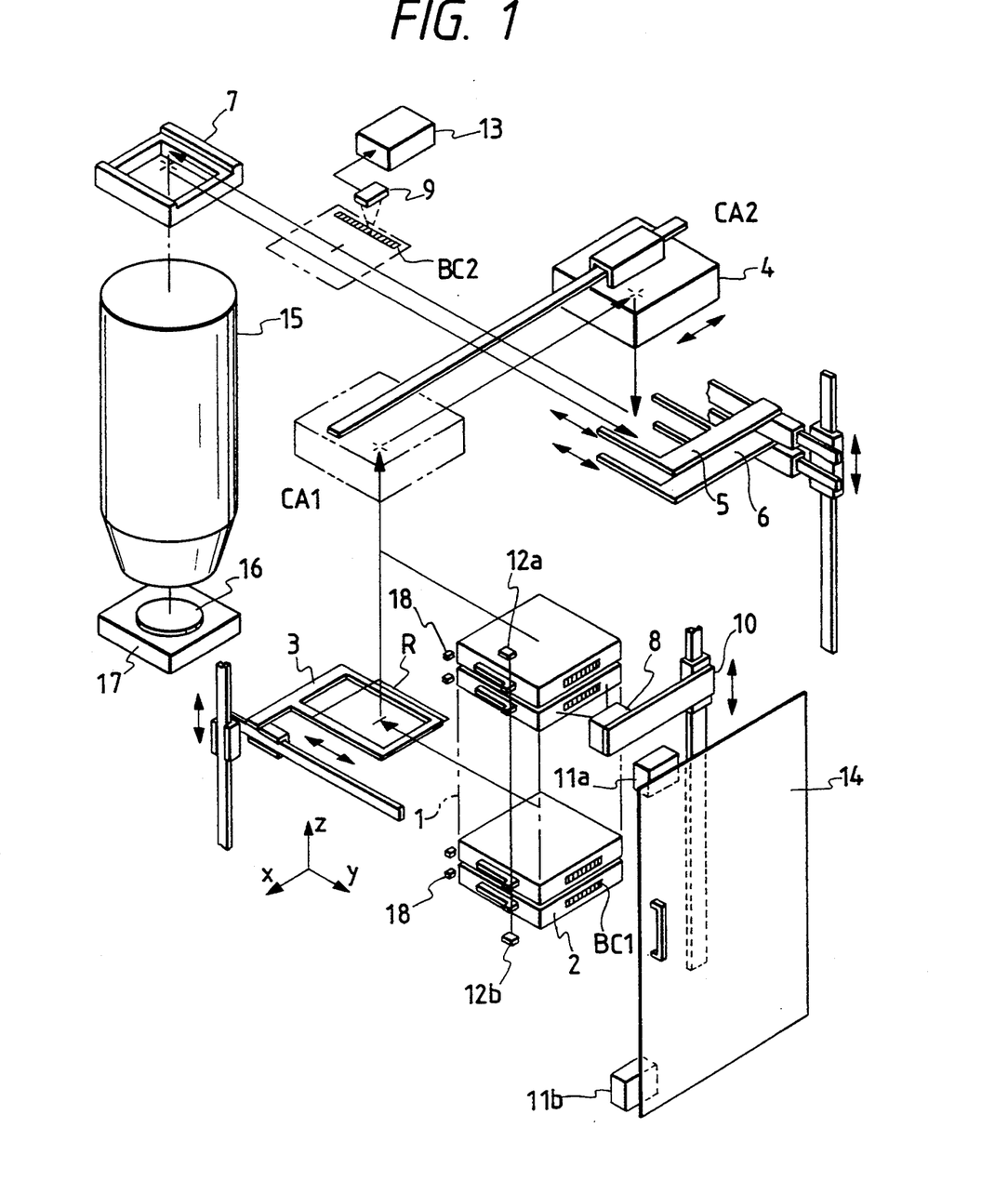
FIG. 1 schematically shows an exposure apparatus with a substrate supervisory device according to an embodiment of the present invention.
Figure 2:
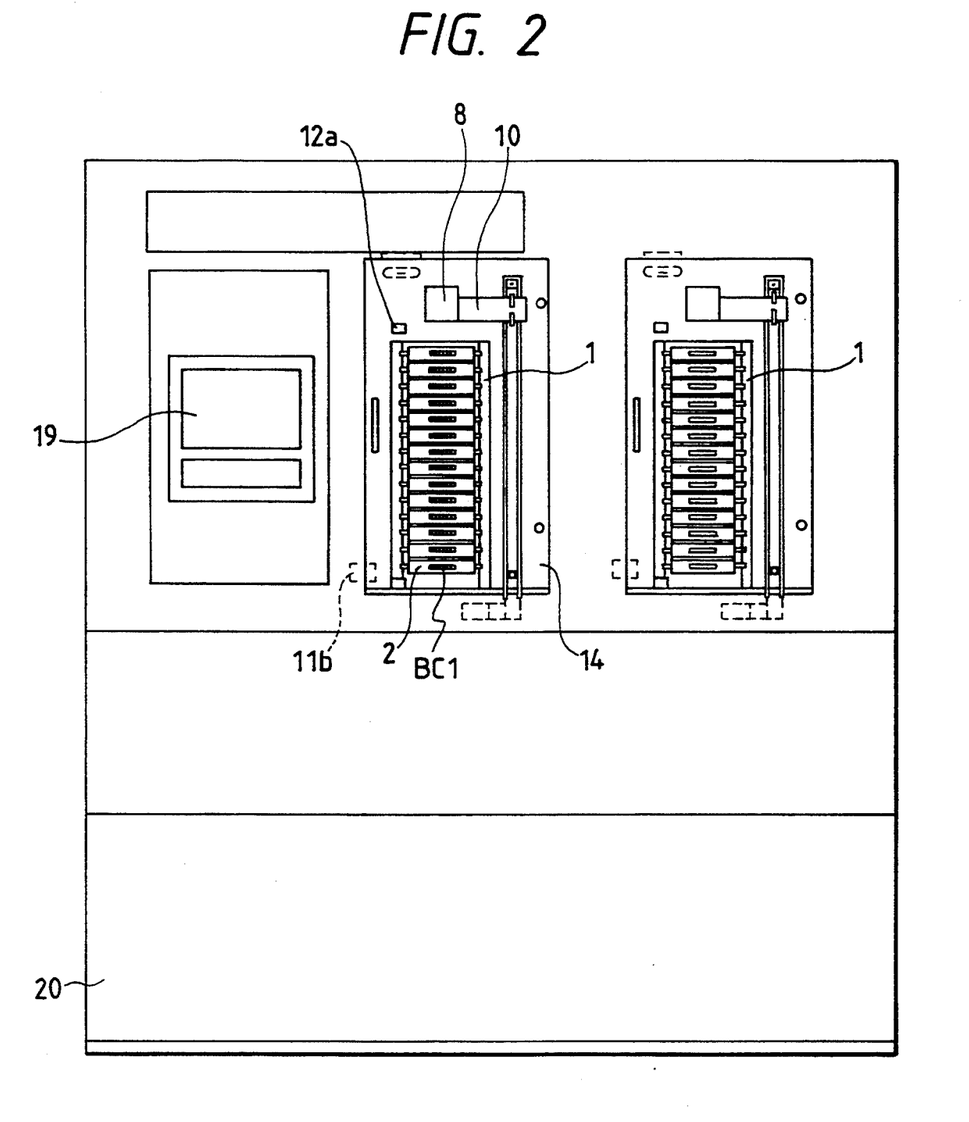
FIG. 2 shows a front view of the exposure apparatus with the substrate supervisory device.

An embodiment of the present invention will be described with reference to the accompanying drawings. FIG. 1 schematically shows a semiconductor exposure apparatus equipped with a substrate supervisory device according to an embodiment of the present invention. FIG. 2 is a front view of the semiconductor exposure apparatus. First, in FIG. 1, a plurality of reticle cases 2 with respective reticles R therein are stored in respective slots of a case storing section (library) 1 by opening a front door 14 of an air-conditioned chamber 20 for housing the semiconductor exposure apparatus. Whether the front door 14 is opened or closed is constantly checked by means of front door detecting sensors 11a and 11b. Similarly, the presence or absence of the loading of the reticle cases 2 in the library 1 is checked by case loading sensors 18 provided for respective slots of the library 1. As the front door 14 is formed of a semitransparent plate such as smoked acrylic, its rigidity is not necessarily high. Then, even though an operator has closed the front door 14 tightly, there is a case that it is warped slightly. Therefore, the respective front door detecting sensors 11a and 11b are provided on two upper and lower portions of the front door 14 to check by ANDs of the two sensors 11a and 11b whether the door 14 is closed properly without a warp.

The respective reticle cases 2 loaded in the library 1 are provided on the back surfaces (surfaces facing the door 14) with removable label-like case bar codes BC1 indicating identification information of the reticles R. The case bar codes BC1 are read by a case bar code reader 8 mounted on a reader drive arm 10 which is moved up and down on the front side of the library 1. Although the identification information of the case bar codes BC1 is identical to that of the respective reticle bar codes BC2 on the reticles R to be described later, the case bar codes BC1 and the reticle bar codes BC2 are recorded by different bar code rules. For example, the case bar codes BC1 are structured by the general code 39 system while the reticle bar codes BC2 are structured by an original system. These bar code rules will be described in detail later. A case position sensor 12a or 12b emits a light beam perpendicular to one side surface of the library 1 to detect whether the light beam is shielded by a portion of the reticle cases 2. Thereby, it is checked whether among the plurality of reticle cases 2, there are reticle cases which are loaded in the uncomplete state.

Next, the structure of the section for transporting the reticles R will be described, which but is disclosed in U.S. Pat. No. 4,433,547 (Dec. 27, 1983) and Japanese Patent Publication No. 3-783 and then will be described briefly. The reticles R in the reticle cases 2 are stored in the library 1 in parallel with the X-Y plane in FIG. 1. Therefore, it can be structured that a desired reticle R can be taken out from or returned back into the corresponding reticle case 2 by a transporting arm 3 movable in the X or Z direction. The transporting arm 3 draws the desired reticle R from its reticle case 2 in the Y direction by entering the reticle case 2 stored in the library 1 and moves in the Z direction up to the highest position to transport the reticle R to a delivery position CA1 where the reticle R is handed over to a carrier 4. The transporting arm 3 is provided with vacuum absorptive holes and holds or releases the reticle R by the on-state or off-state of a vacuum pump (not shown). The carrier 4 is movable in the X or Z direction and has absorptive holes on the lower portion thereof. Also, the carrier 4 is provided with a mechanism (not shown) for prealigning the reticle R by sandwiching it from two directions based on four sides of the carrier 4. The carrier 4 transports the reticle R from the delivery position CA1 to a position CA2.

A load arm 5 and an unload arm 6 are movable in the Y or Z direction. The load arm 5 and the unload arm 6 are movable separately in the Y direction between the position CA2 and a reticle stage 7 and movable together in the Z direction. The load arm 5 and the unload arm 6 are provided with vacuum absorptive holes for holding the reticle R in a similar manner to the transporting arm 3 and holds or releases by the on-state or off-state of a vacuum pump.

The reticle stage 7 is provided in the main body of the projection exposure apparatus to place the reticle R thereon for exposure. An original pattern of the reticle R placed on the reticle stage 7 is transferred to a wafer 16 on a wafer stage 17 via a projection lens 15. In the apparatus, a bar code reader 9 is provided to read the reticle bar code BC2 on the reticle R being transported toward the reticle stage 17 by the load arm 5. Also, a processing section 13 for analyzing the content of the bar code reader 9 is provided. The bar code reader 9 may have any structure and may be disposed anywhere if it is disposed on the reticle transporting path between the library 1 and the reticle stage 7.

Next, referring to FIG. 2, a display and operation section (a cathode-ray tube and a keyboard) 19 is provided on the external surface of the air-conditioned chamber 20 of the semiconductor exposure apparatus equipped with the substrate supervisory device of the present invention. As the identification information is recorded on the reticle bar codes BC2, it is possible to select or register the plurality of reticles R in the display and operation section 19. The read identification information of the reticle bar code BC2 and the case bar code BC1 and commands, conditions and identification information manually input from the display and operation section 19 are corresponded to each other together with the pattern information and various exposure process conditions of the reticle R to be used. Therefore, the read information of the reticle bar code BC2 and the case bar code BC1 and the information of the commands, conditions and the like input from the display and operation section 19 are compared with each other by a computer for controlling the apparatus connected to the display and operation section 19. Further, in the present invention, as shown in FIG. 2, two libraries 1 with the same construction are arranged laterally and a reticle can be selectively transported from both libraries 1.

Figure 3:
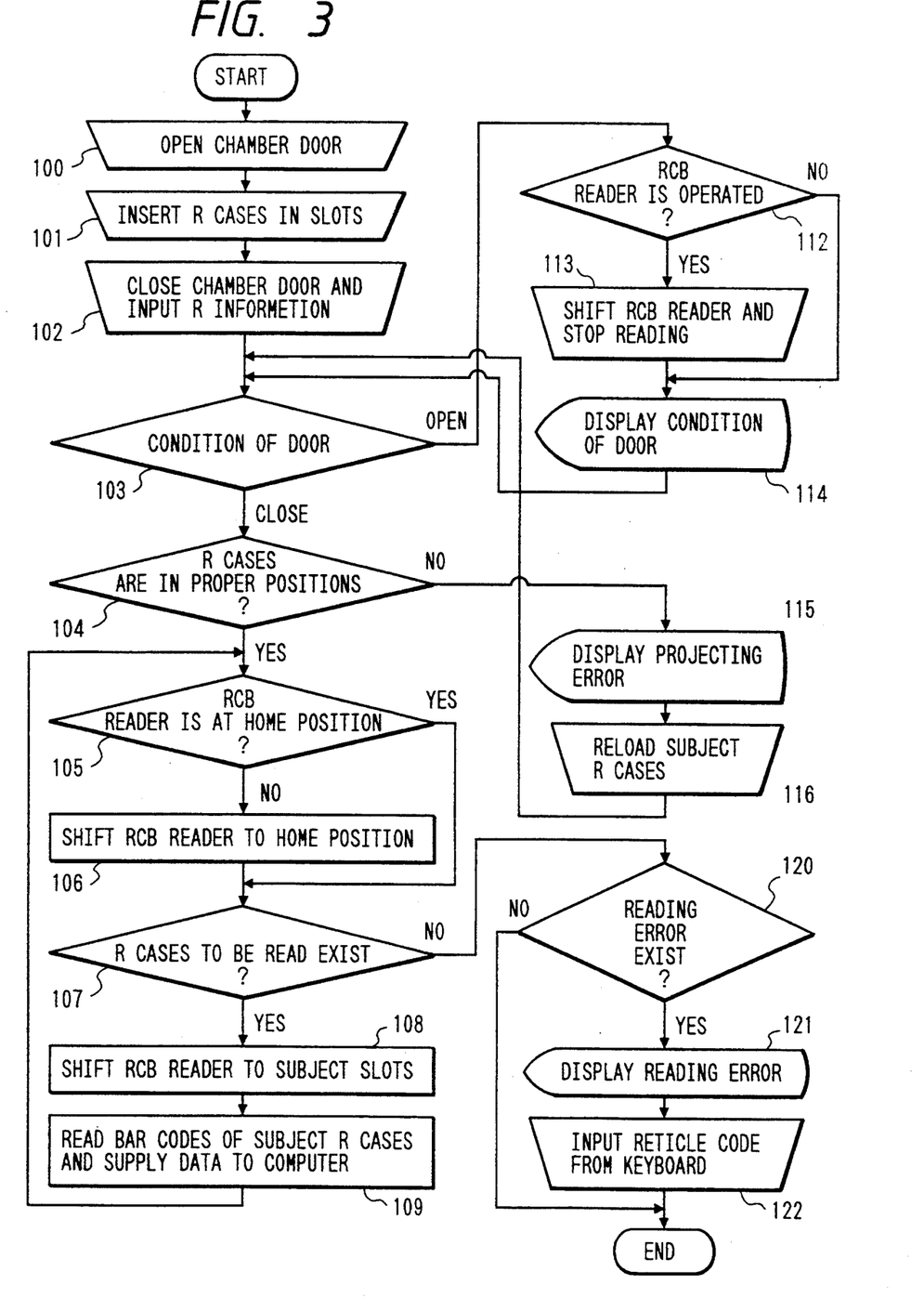
FIG. 3 is a flowchart showing a sequence of the case bar code reader of the embodiment.
Figure 4:
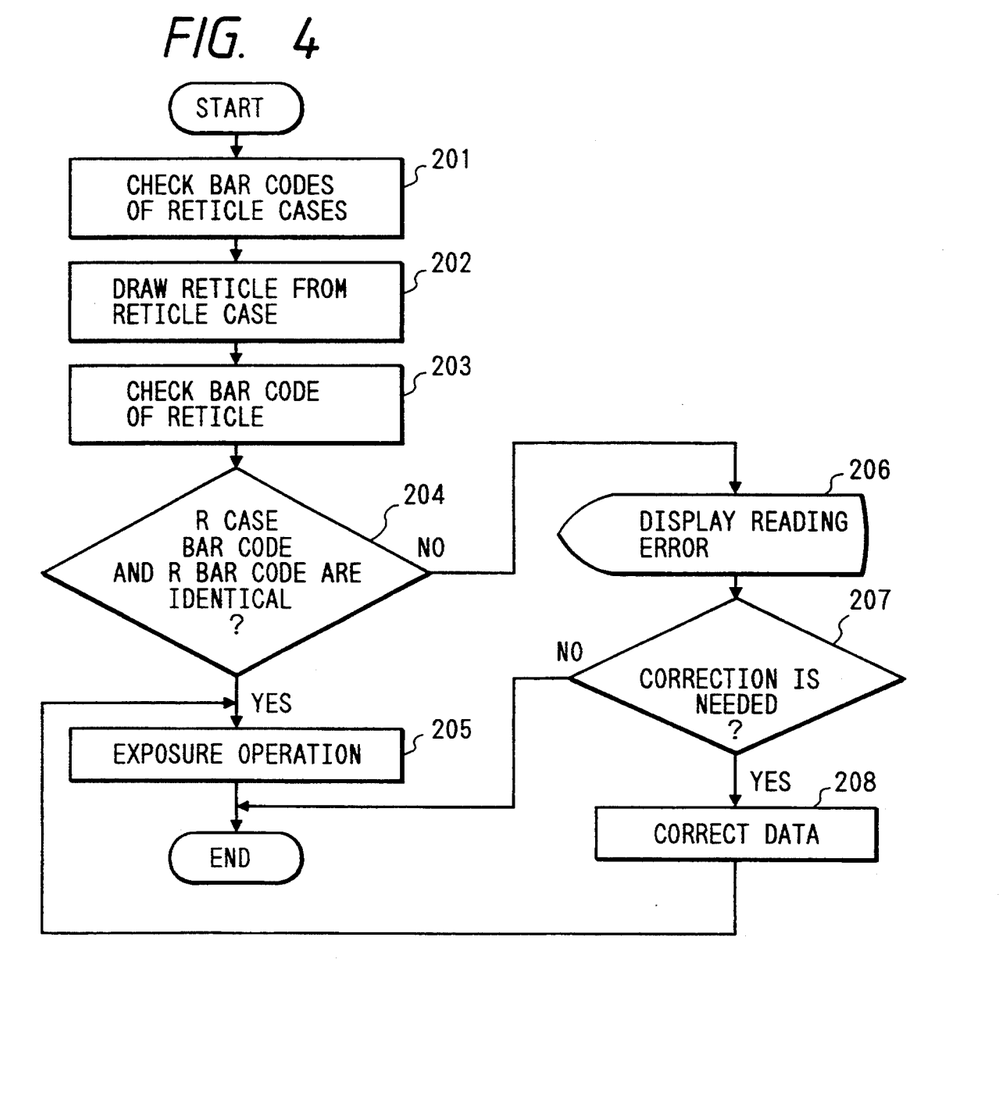
FIG. 4 is a flowchart showing a sequence for comparing the identification information.

Next, the operation of the above-structured semiconductor exposure apparatus will be described with reference to FIGS. 3 and 4. FIG. 3 shows a sequence of the case bar code reader 8 of the embodiment independently. FIG. 4 shows a sequence for comparing the identification information by the computer (not shown) connected to the display and operation section 19. In FIG. 3, when loading the desired reticles R in the exposure apparatus to expose the wafer 16, the steps 100 to 102 are performed manually by the operator while the step 103 and thereafter are performed automatically by the exposure apparatus.

First, in the step 100, the operator opens the front door 14 manually. The front door 14 is locked automatically such that it can be opened only when the drive arm 10 of the case bar code reader 8 is in the standby condition, i.e., in the highest position, as shown in FIG. 2. At this time, the computer ascertains that the front door detecting sensors 11a and 11b are turned off and stops the operation of the case bar code reader 8 as well as the operation of the reader drive arm 10 completely. Thus, the front door 14 is locked by a safety mechanism (not shown)-so as not to be opened until the reader drive arm 10 is raised up to a home position provided on the upper end portion of the library 1, which enhances safety for the inexperienced operator.

Next, the operator inserts the reticle case 2 (one or a plurality of reticle cases) containing the desired reticle R in the slot of the library 1 in the step 101 and closes the front door 14 of the air-conditioned chamber 20 manually in the step 102. Thereafter, the operator inputs the information and the title of the reticle R and commands the start of an exposure process. At this time, the information of the reticle R and the condition (especially, the position of the stored reticle, the transporting condition and the like) of the exposure apparatus are constantly displayed in the display and operation section 19 ascertainably.

Then, in the steps 103 to 105, the exposure apparatus checks the condition of the libraries 1 automatically and judges whether the operation moves to the following step. First, in the step 103, the computer checks by means of the front door detecting sensors 11a and 11b whether the front door 14 is opened or closed. When either the front door detecting sensor 11a or 11b indicates the state that the front door 14 is opened, the process goes to the step 112. Then, when the case bar code reader 8 and the reader drive arm 10 are not operated, the process goes to the step 114, where the display and operation section 19 displays the warning that the front door 14 is opened and the computer waits until the front door detecting sensors 11a and 11b detect the state that the front door 14 is closed.

Also, in the step 112, when the case bar code reader 8 and the reader drive arm 10 are operated, the operations thereof are entirely stopped in the step 113. Then, in the step 114, the display and operation section 19 displays warning similarly and the computer repeats the step 103 until the front door detecting sensors 11a and 11b indicate the closed state.

On the other hand, when the front door detecting sensors 11a and 11b detect the closed state of the front door 14, the process goes to the step 104. Then, the outputs of the reticle case loading sensors 18 and the case position sensors 12a and 12b are checked in order to judge whether the reticle cases 2 are loaded properly. That is, when the reticle cases 2 are inserted in the respective slots of the libraries 1 properly, the reticle case loading sensors 18 corresponding to the respective slots are turned on to indicate closed states as well as the case position sensors 12a and 12b are turned on and the process moves to the step 105.

When the reticle cases 2 are located in abnormal positions in the libraries 1, i.e., the reticle cases 2 are not inserted in positioning mechanisms (not shown) within the slots of the libraries 1 completely and slightly projected toward the front door 14 (projecting error), light beams from the case position sensors 12a and 12b are shielded by portions of the reticle cases 2 and the uncomplete loading states of the reticle cases 2 in some slots in the libraries 1 are checked even though the reticle case loading sensors 18 are turned on to indicate the closed states. In such a case, the computer performs the step 115 in order to prevent mechanical interference (collision) between the reader drive arm 10 and the reticle cases 2 as well as the reading error of the case bar codes.

That is, in the step 115, the exposure apparatus indicates in the display and operation section 19 for the operator the warning that there are projecting errors of the reticle cases 2. At this time, when there are slots wherein the reticle case loading sensors 18 are turned off to indicate opened states even though the reticle cases 2 are loaded therein, the computer detects the slot numbers and displays them in the display and operation section 19. However, therefor, it is necessary to provide switches for the respective slots and the operator needs to press the switches at the time of loading the reticle cases 2 thereby to inform the computer that the reticle cases 2 are loaded in the respective slots of the libraries 1. In the step 116, after the operator opens the front door 14 and finds the reticle cases 2 in the abnormal positions based on the information of the display and operation section 19, he reloads the reticle cases 2 in the libraries 1. At this time, as the front door 14 is opened, the process returns back to the step 103.

Also, the case position sensors 12a and 12b are transmittance type sensors. Therefore, although the number of reticle cases 2 located in abnormal positions is singular or plural, the light beam emitted from the case position sensor 12a as a light emitting portion is shielded by a portion of a reticle case 2 located in the abnormal position so that the case position sensor 12b as a light receiving portion cannot detect the emitted light flux. As a result, the abnormal loading state of a single reticle case 2 is detected.

In the above process, when no abnormal state has been found, the safety checking operation prior to the reading process has been completed and the reading process for the case bar codes BC1 shown in the steps 105 to 111 is performed. In the step 105, it is checked whether the case bar code reader 8 (referred to as the RCB reader in FIG. 3) and the reader drive arm 10 which should be located usually in the home position are in the operating condition (in a position other than the home position). When those are in the operating condition, the case bar code reader 8 and the reader drive arm 10 are returned to the home position and the position checking operating of the case bar code reader 8 is performed. Also, when the reading operation of the case bar codes BC1 has been finished and the case bar code reader 8 is in the other process condition or in the standby condition, the step 107 is performed.

In the step 107, it is judged whether the reticle cases 2 with the case bar codes BC1 to be read exist. This step is necessary because when the operator has loaded, e.g., five new reticle cases 2 in the step 101, the reader drive arm 10 is moved successively to the rear surfaces of the new five reticle cases 2 in the step 108 and to make the case bar code reader 8 read the case bar codes BC1 attached to the rear surfaces of the five reticle cases 2 successively in the step 109. The read information is sent to the computer together with the position information of the corresponding slots. At this time, even though the reading error of the case bar code BC1 occur in the step 109, the computer of the exposure apparatus registers the information including the error and effects the reading of the case bar code BC1 of the following reticle case 2. Needless to say, the information sent and registered in the computer is supervised by the computer. And, the reticle bar codes BC2 of the reticles R and the various information input from the display and operation section 19 are used for comparison thereby to perform various processes in the exposure apparatus.

When the case bar code BC1 of the fifth new reticle case 2 has been read, the computer judges, in the step 107, that there is no reticle case 2 further to be read. Then, in the step 120, the presence or absence of the reading error is checked. When there is no reading error, the process is completed. However, when there is the reading error, the computer displays the error condition (status) as well as the necessary operation for avoiding the error in the display and operation section 19 in the step 121.

In the step 122, the operator inputs the errored information (reticle code) and the various correcting operations from the keyboard of the display and operation section 19. Thereby, the case information including the reading error is promptly corrected to avoid an exposure process with a wrong reticle.

Further, the open or close condition of the front door 14 checked in the step 103 is detected constantly by the front door detecting sensors 11a and 11b. Then, if the detected signals are sent to a host computer for supervising a plurality of exposure apparatuses, the condition of the front door 14 can be checked not only in the single exposure apparatus but also in the host computer, enabling the doubly safe supervision. In this case, it is possible to activate the warning system in the factory from the host computer. Further, if the information of the case bar code BC1 read in the step 109 is sent to the host computer and supervised thereby, the host computer for wholly supervising the lithography process can perform the location supervision of a plurality of reticles being processed in all the exposure apparatuses or inspecting apparatuses promptly.

Next, referring to FIGS. 1 and 4, the sequence for comparing the case bar code BC1 of the reticle case 2, the reticle bar code BC2 of the reticle R and the identification information and the like of the reticle input from the display and operation section 19 of the exposure apparatus by the operator and determining the processes of the exposure apparatus from the result of the comparison of the identification information will be described hereinafter. In the step 201 shown in FIG. 4 corresponding to the previous step 109, the case bar codes BC1 on the reticle cases 2 loaded in each of the libraries 1 on the reticle cases 2 are read by the case bar code reader 8 and the identification information of the reticles R contained in the case bar codes BC1 is registered in the control computer of the exposure apparatus and sent to the host computer in the factory.

Next, in the step 202, the reticle R to be used for exposure is drawn from the reticle case 2 by the transporting arm 3 based on the instructions of the computer and handed over to the carrier 4 at the delivery position CA1 for the carrier 4 located above the library 1 on the rear side thereof. The handed over reticle R is prealigned on the carrier 4 accurately and moved together with the carrier 4 to the delivery position CA2 for the load arm 5. At this time, as the reticle R is attached securely to the carrier 4 by the vacuum absorption, the movement error of the reticle R in the XY plane does not practically occur after the prealignment. Then, the load arm 5 is advanced from a retreat position so as to be directly under the carrier 4 waiting at the position CA2. Thereafter, the load arm 5 is raised up (Z direction) to properly receive the reticle R prealigned on the carrier 4.

Next, in the step 203, the load arm 5 with the reticle R placed thereon is advanced at a constant speed directly under the bar code reader 9 for reading the reticle bar code BC2 while receiving synchronous signals from the processing section 13. Immediately after the identification information (title) of the reticle bar code BC2 on the reticle R is read by the bar code reader 9, the read identification information is registered in the control computer of the exposure apparatus and sent to the host computer. Next, in the step 204, the identification information (title) on the reticle case 2 read in the step 201 is compared with that on the reticle R read in the step 203 to check whether those are identical. At this time, the identification information (title) of the reticle input from the display and operation section 19 by the operator is also compared with the identification information on the reticle case 2 and the reticle R. In the step 204, when the identification information of one of those group is different from the identification information of the others, the process goes to the step 206 wherein the computer displays the error information in the display and operation section 19.

Then, in the step 207, based on the displayed error information, the operator judges whether the erroneously read identification information is corrected or not. When not conducting the correction, its reticle R is handled as the unexposed and erroneous reticle and the process of checking the reticle is completed. However, when the operator judges, in the step 207, that the identification information should be corrected, and thereafter corrects various data of the identification information into a proper condition in the step 208, or when, in the step 204, the identification information of the reticle case 2, the identification information of the reticle R and the identification information of the reticle input by the operator coincide with each other, an exposure operation is effected to the wafer in the step 205 to finish the sequence of the process for the reticle R.

In the substrate supervisory system of this embodiment, the rule of the reticle bar codes BC2 representing the identification information on the reticles R is differentiated from that of the case bar codes BC1 representing the identification information on the reticle case 2. For example, the reticle bar codes BC2 are formed by the original code system and the case bar codes BC1 are formed by the general code 39 system, aiming at variety for means of the comparison and the reference together with the input information by the operator. Although the identification information of the reticles R and the substrate case is represented by the bar code systems in the substrate supervisory system in this embodiment, either the identification information of the reticles R or that of the substrate case may be represented by characters, dots or the like and a combination of the bar code system and characters, dots or the like can be adopted, which also contributes to variety of means for the comparison and the reference.

As above, when differentiating the bar code rule of the bar codes BC2 on the reticles R from that of the bar codes BC1 of the reticle cases 2, as an example of the bar code rule of the original code system, there is a system disclosed in, e.g., U.S. Pat. No. 4,567,361. In the disclosed system, a character or a control code (synchronism, start, stop, etc.) is represented by three dark bars (the widths of the dark bars and the distances between the dark bars are varied).

As the other original system bar code rule, there is a system wherein a character code is represented by bars of eight bits (the width of a bar is, e.g., 0.23 mm). In this case, the first bit to be first read in the scan direction is a start bit and the final eight bit is a stop bit. Then, the start bit is usually set to be a dark bar and the stop bit is usually set to be a transparent bar (ground color). Various characters (letters, figures, symbols, etc.) are defined with six bits, i.e., the second to seventh bits between the start and stop bits. A bar code is read from the side of the start bit to the side of the stop bit but cannot be read from the opposite direction.

Figure 5:
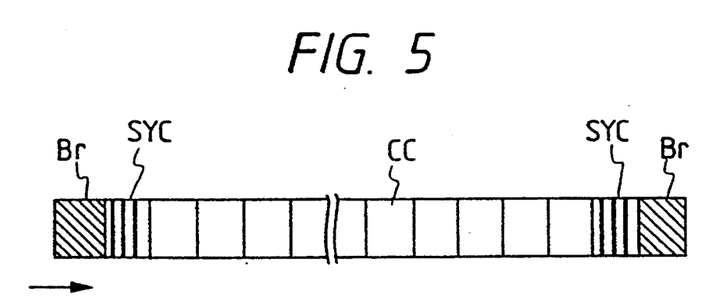
FIG. 5 shows an example of a code pattern by an original bar code rule.

Such a bar code rule will be described with reference to FIGS. 5 and 6. FIG. 5 shows the arrangement of a series of bar codes which are read (scan by a laser spot or the like) in the direction indicated by an arrow. The lateral ends of the bar code train are provided with respective blanks Br each of which is darkened over a width corresponding to one code (eight bits). Respective synchronous codes SYC are arranged after the blank Br on the reading start side and before the blank Br on the reading end side. The synchronous code SYC is formed of three dark bars arranged every other bit. In order to distinguish the synchronous codes SYC from the other character codes CC, the first bit of the synchronous code SYC is set to be a transparent bar while second, fourth and sixth bits are set to be dark bars.

Figure 5A:
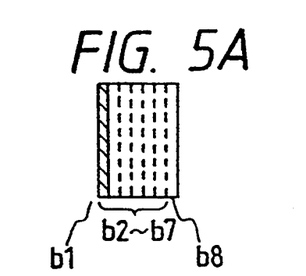
FIG. 5A shows a portion of the code pattern of FIG. 5 enlarged.

As shown in FIG. 5A, the first bit b1 of the character code CC is determined to be a dark bar and the eighth bit b8 is determined to be a transparent bar. The second to seventh bits (b2 to b7) represent a character.

Figure 6A:
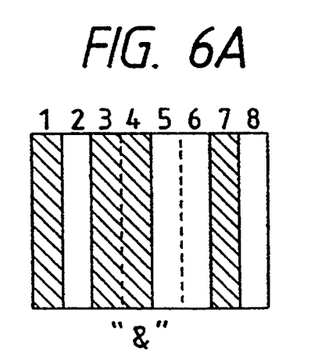
FIGS. 6A to 6C show an example of character codes by the original bar code rule.
Figure 6B:
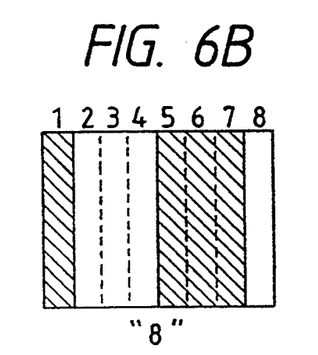
Figure 6C:
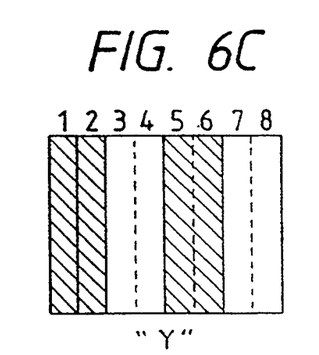

FIGS. 6A to 6C show examples of the character codes CC. Four groups are represented with two bits of the sixth bit b6 and the seventh bit b7. As shown in FIG. 6A, chiefly symbols "#" "&" "%" "/" etc. expressed with four bits of bits b2 to b5 are assigned to the group wherein b6="0" (transparent bar) and b7="1" (dark bar). Also, as shown in FIG. 6B, chiefly figures "0" to "9" are assigned to the group wherein b6="1" and b7="1" while, as shown in FIG. 6C, chiefly characters "A" to "Z" are assigned to the group wherein b6="1" and b7="0" and the group wherein b6="0" and b7="0".

Such bar code trains are used as the bar codes BC2 of the reticles R but may be used as the bar codes BC1 of the reticle cases 2. For example, the original code rule as shown in FIGS. 5 and 6 may be used for the bar codes BC1 of the reticle cases 2 and the original code rule disclosed in U.S. Pat. No. 4,567,361 may be used for the bar codes BC2 on the reticles R.

Also, even though the code rules are different, it is a fundamental principle that when the title represented by the bar code BC1 on the reticle case is, e.g., "TEST-EXP. AA", the title represented by the bar code BC2 on the reticle R is determined to be "TEST-EXP. AA".

This fundamental principle is necessary because the read content of the bar code BC1 of the reticle case is compared directly with that of the bar code BC2 of the reticle. However, it is not necessarily requried to follow the fundamental principle when the comparison process is performed by adding the title, the code or the like input from the keyboard of the display and operation section 19 by the operator, as described above. For example, when the title registered from the display and operation section 19 by the operator is "TEST-EXP. AA 1505G9-AA", the comparison result can be judged to be proper even though "TEST-EXP. AA" is given to the bar code BC1 of the reticle case as the title and "1505G9-AA" is given to the bar code BC2 of the reticle R as the title. That is, the computer of the apparatus judges the properness of the reticle case from the fact that a portion of the title registered by the operator coincides with the title of the reticle case. Also, the computer judges the properness of the reticle R from the fact that a portion of the title registered by the operator coincides with the title of the reticle R.

In such a case, the operator seems to make a mistake when manually containing the reticle R in the reticle case 2. However, since actually, simple letters distinguishable at a glance are also printed on the reticle R and the reticle case 2 as information patterns, such a mistake scarcely occurs.

Figure 7:
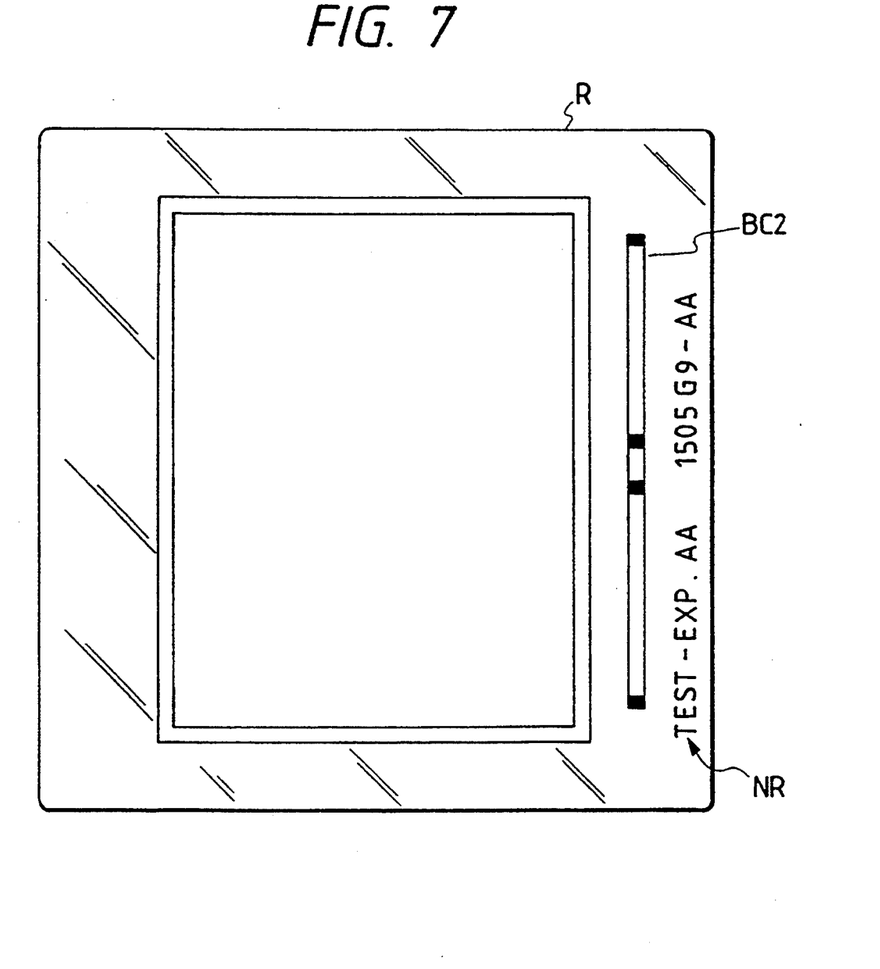
FIG. 7 shows an example of the arrangement of a bar code BC2 and a title by the letter indication on a reticle.
Figure 8:
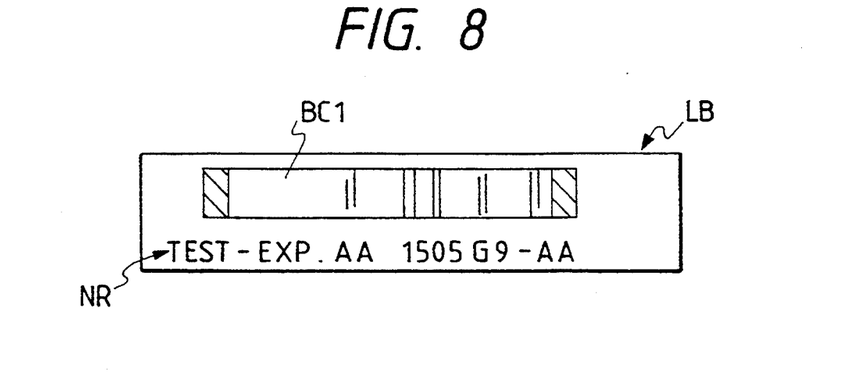
FIG. 8 is an example of a label printed with a bar code BC1 and a title by the letter indication, which is attached to a reticle case.

FIG. 7 shows an example of the arrangement of the bar code BC2 on the reticle R and the letter indication NR representing the title of the reticle R. FIG. 8 shows an example of the arrangement of the bar code BC1 and the letter indication NR representing the title of the reticle on a label LB which is attached to the reticle case 2. Generally, the operator checks the letter indications NR on the reticles R and the reticle cases 2 and combines the reticles R with the respectively corresponding reticle cases 2. Therefore, when performing the comparison process by adding the title registered from the keyboard by the operator, it is not necessarily required that the respective bar code BC1 or the respective bar code BC2 represent the letter indication NR entirely.

According to the above-described embodiment, the substrate case storing sections 1 are provided with a function for automatically reading the case bar codes BC1 representing the identification information on the substrate cases and there is provided with a function for automatically reading the reticle bar codes BC2 representing the identification information on the reticles R. And, the identification information of the case bar codes BC1, the identification information of the reticle bar codes BC2 and the input identification information by the operator can be automatically compared and referred to each other to check, register and correct the various information, thereby contributing to the automatic supervision of the reticles. In addition, in the substrate supervisory device, the identification information of the bar codes BC2 on the reticles R is different from the identification information of the reticle bar codes BC1 on the reticle cases 2. For example, the reticle bar codes BC2 are formed by the original code system and the case bar codes BC1 are formed by the code 39 system. Therefore, even though large amounts of defects occur in the identification information of one group (original system bar codes) during manufacture to cause the frequent reading error or reading disability, it is possible to prevent large quantities of faulty lots due to the reading disability and reading error by the identification information of the other group (e.g., code 39). Also, as the whole information being supervised is replaceable by the faultless identification information (e.g., code 39), it is possible to effect error treatment with a very little time loss. That is, if it is found from usual experience that e.g., detects are liable to occur in the code 39 for forming the case bar codes BC1, in the display and operation section 19, priority is given to the original system bar code for forming the reticle bar codes BC2. Then, if as the result of comparison, the difference is recognized between the respective identification information, priority is given to the reticle bar codes BC2 automatically upon the software to effect error treatment in accordance with the reticle bar codes BC2, unnecessitating time for recovery. Thereby, the operator does not need to observe the reticle R and the identification information visually. Also, it is possible to obtain very high safety for comparison of the identification information differently from utilizing the identification information formed of the single bar code system in which detects (e.g., detects of bar codes and characters) are liable to occur. Further, the automation of the semiconductor manufacturing process can be expected and it is possible to prevent erroneous exposure to the wafer with an unproper reticle, thereby preventing large manufacturing loss.

Although not only the opening or closing condition of the front door 14 of the air-conditioned chamber 20 but also the loading conditions of the respective reticle cases 2 are detected prior to driving the case bar code reader 8, it is not necessarily required to check the opening or closing condition of the front door 14. In that case, it is necessary to provide infrared sensors (obstacle detecting sensors) for detecting the operator's hand.

Although the supervision for the reticle cases 2 loaded in the exposure apparatus is described in the above embodiment according to the present invention, the application of the present invention is not limited to the exposure apparatus. For example, the present invention is applicable to an apparatus disclosed in U.S. Pat. No. 4,715,392 (Dec. 29, 1987), wherein a reticle in a reticle case loaded in a library is taken out form the reticle case horizontally, subjected to inspection for detecting foreign particles thereon and cleaned to remove the foreign particles after held vertically.

Such a cleaning apparatus is constituted of the library for loading a plurality of cases, a transporting mechanism for transporting respective reticles in the reticle cases, an inspecting section for detecting foreign particles attached to the reticles photoelectrically, a cleaning section for scrubbing or effecting wet rinsing and an air-conditioned chamber with a front door for containing the library, the transporting mechanism, the inspecting section and the cleaning section in an air-conditioned and dustproof space.

Also, the present invention can be applied to a reticle stocker for storing more than hundreds of reticles. The reticle stocker has hundreds of shelves in an air-conditioned chamber and stores the reticles thereon in a naked state. When taking out a desired reticle for the exposure apparatus or the cleaning apparatus, an empty reticle case is set in the library by opening the front door of the air-conditioned chamber and the desired reticle on a shelf is taken out by an automatic transporting mechanism and contained in the specified case automatically. Accordingly, also, in this case, an information pattern attached to the reticle case is compared with an information pattern attached to the reticle to judge the properness thereof, thereby preventing a wrong reticle to be taken out.

According to the present invention, when reading an information pattern given to a mask (reticle) case automatically, the safety for the operator is fully taken into consideration, so that it is possible to prevent the operator from being injured owing to the relative movement of the information reading means. Also, the accident caused by the uncomplete loading state of the reticle cases (collision with the reading means) can be prevented.

What is claimed is:

1. An apparatus for processing a plurality of masks, comprising:
    case storing means for removably holding a plurality of cases for containing said respective plurality of masks to be processed;
    mask processing means for drawing said mask from selected one of said cases in said case storing means and processing said selected mask;
    containing means with an openable door for containing said case storing means and said mask processing means;
    said cases being inserted in said case storing means or taken out therefrom by opening said door;
    information reading means for reading case information patterns given to respective specific positions of said cases with said cases contained in said case storing means;
    shifting means for relatively shifting said information reading means and said case storing means along the aligning direction of said plurality of cases such that said information reading means faces said respective specific positions;
    detection signal outputting means for detecting whether there is hindrance for said shifting means to be driven and outputting a detection signal; and
    control means for starting or stopping the operation of said shifting means based on said detection signal.

2. An apparatus according to claim 1, wherein said information reading means is disposed in a space between said case storing means and said door.

3. An apparatus according to claim 2, wherein said case storing means has a plurality of slots aligned in the up-and-down direction, said respective cases are inserted in said slots by opening said door, said information reading means is shifted by said shifting means in the up-and-down direction with respect to said case storing means, each of said information patterns is formed on a label removably attached to one side surface of each of said cases and said side surfaces with said respective labels attached thereto are opposite to said door in the state that said cases are inserted in said respective slots.

4. An apparatus according to claim 1, wherein said mask processing means is exposure means for transferring a pattern of said selected mask to a photosensitive substrate and said containing means has an air-conditioned and dustproof space.

5. An apparatus according to claim 1, wherein said mask processing means is inspecting means for photoelectrically detecting foreign particles attached to said selected mask, cleaning means for cleaning said selected mask or mask storing means for storing said selected mask in a naked condition and said containing means has an air-conditioned and dustproof space.

6. An apparatus according to claim 1, wherein said detection signal outputting means detects the opened state of said door and outputs an opened state detection signal and said control means prevents the operation of said shifting means when detecting the opened state detection signal.

7. An apparatus according to claim 1, wherein said detection signal outputting means detects that said cases loaded in said case storing means are not loaded in respective predetermined positions and outputs a case loading detection signal and said control means prevents the operation of said shifting means when detecting the case loading detection signal.

8. An apparatus according to claim 1, wherein said detection signal outputting means detects that an operator puts his hand in said case storing means via said door in the opened state and outputs an operator's operation detecting signal and the control means prevents the operation of said shifting means when detecting the operator's operation detecting signal.

9. An apparatus according to claim 1, wherein said detection signal outputting means comprises opened state detecting means for detecting the opened state of said door and outputting an opened state detection signal and case loading detecting means for detecting that said cases loaded in said case storing means are not properly loaded in respective predetermined positions thereof and outputting a case loading detection signal and said control means prevents the operation of said shifting means when detecting either the opened state detection signal or the case loading detection signal.

10. An apparatus according to claim 1, wherein said detection signal outputting means comprises operator's operation detecting means for detecting that an operator puts his hand in said case storing means via said door in the opened state and outputting an operator's operation detecting signal and case loading detecting means for detecting that said cases loaded in said case storing means are not properly loaded in respective predetermined positions and outputting a case loading detection signal and said control means prevents the operation of said shifting means when detecting either said operator's operation detecting signal or the case loading detection signal.

11. An apparatus according to claim 1, wherein said door has a lock mechanism and while said shifting means is activated by said control means, said lock mechanism prevents said door from being opened.

12. An apparatus according to claim 1, wherein said control means moves said shifting means so as to make said information reading means read an information pattern given to a new case loaded in one of said plurality of slots instead of said old case, and thereafter controls said shifting means to a retreated position away from a space in front of said plurality of slots.

* * * * *